United States Patent [19]

Fujii et al.

[11] Patent Number: 5,001,168

[45] Date of Patent: Mar. 19, 1991

[54] ADHESIVE FOR SURFACE MOUNTING DEVICES

[75] Inventors: Ryuichi Fujii, Saitama; Rihei Nagase, Tokyo, both of Japan

[73] Assignee: Somar Corporation, Tokyo, Japan

[21] Appl. No.: 376,081

[22] Filed: Jul. 6, 1989

Related U.S. Application Data

[63] Continuation-in-part of Ser. No. 138,421, Dec. 28, 1987, abandoned.

[30] Foreign Application Priority Data

Dec. 27, 1986 [JP] Japan ................................. 61-314021

[51] Int. Cl.$^5$ ...................... C09J 11/06; C09J 167/06; C08F 283/01
[52] U.S. Cl. ........................................ 522/14; 522/18; 522/107; 525/25; 525/27; 525/44
[58] Field of Search ........................... 522/14, 18, 107; 525/25, 27, 44; 523/508; 524/722, 724

[56] References Cited

U.S. PATENT DOCUMENTS

| | | | |
|---|---|---|---|
| 3,398,213 | 8/1968 | Chetakian | 525/25 |
| 3,840,617 | 10/1974 | Demmler | 525/25 |
| 4,374,940 | 2/1983 | Bhatia | 524/854 |

*Primary Examiner*—John C. Bleutce
*Assistant Examiner*—David Buttner
*Attorney, Agent, or Firm*—Sughrue, Mion, Zinn, Macpeak & Seas

[57] ABSTRACT

An adhesive for surface mounting devices comprising a polymerizable prepolymer, a reactive diluent, and a polymerization initiator, the adhesive further comprising as a chelating agent an aminopolycarboxylic acid having at least one hydroxyethyl group bound to the nitrogen atom thereof or an alkali metal salt thereof, and as a curing accelerator cupferron or a metallic salt thereof.

8 Claims, No Drawings

ADHESIVE FOR SURFACE MOUNTING DEVICES

CROSS-REFERENCE TO RELATED APPLICATION

This is a continuation-in-part of U.S. patent application Ser. No. 07/138,421, filed Dec. 28, 1987, now abandoned.

FIELD OF THE INVENTION

This invention relates to a photopolymerizable and heat polymerizable adhesive for surface mounting devices (hereinafter "SMD"), which contains specified amounts of specified components.

The adhesive of this invention is used in the case where printed circuit boards are temporarily fitted with SMD such as, for example, chip resistors, chip capacitors, SOT's, flat-pack IC's, etc.

BACKGROUND OF THE INVENTION

Heretofore, when printed circuit boards were temporarily fitted or mounted with so-called SMD such as chip resistors, chip capacitors, SOT's, flat-pack IC's, etc. having no lead-wire, use of an adhesive which is curable by both ultraviolet light and heat has been known. An adhesive of this sort is applied onto a printed circuit board by the screen printing method, a method using a dispenser apparatus, a method using a transfer pin, etc., and, after cautiously placing SMD on the printed circuit board, an ultraviolet light is irradiated to cure the adhesive. In this case, even the adhesive portions that have not been irradiated with an ultraviolet light, such as the adhesive underlying the SMD, can also be completely cured either by heat which is subsidiarily generated at the time of irradiation of an ultraviolet light or by combined use of a curing furnace separately installed.

In such a prior art technique, ultraviolet light-curable adhesives which are endowed with heat curing properties by the addition of a heat polymerization initiator such as organic peroxides have been used.

However, adhesives which have hitherto been known have a number of defects in storage stability, gel time, coating properties, heat curing speed, adhesion strength, etc. That is, if the heat curing speed is increased, not only does the storage stability become poor, but also the viscosity of the adhesive remarkably rises which adversely affects the coating properties. On the other hand, if the storage stability is improved, although the coating properties are improved, the heat curing speed becomes so slow that the adhesion strength and gel time can no longer be sufficient. Therefore, none of the conventional adhesives can satisfy all of the storage stability, coating properties heat curing speed, gel time, and adhesion strength simultaneously.

SUMMARY OF THE INVENTION

An object of this invention is to provide an adhesive which can fully satisfy all of the properties of storage stability, coating properties, heat curing speed, gel time, and adhesion strength simultaneously from the practical standpoint while overcoming the above described defects.

In order to achieve this object, the present inventors have made extensive investigations on adhesives which comprise a polymerizable prepolymer, a reactive diluent, and a polymerization initiator as components. As the result, they have found that combined use of a specified chelating agent and a specified curing accelerator is extremely useful for achievement of the above-described object.

That is, the present invention relates to an adhesive for surface mounting devices comprising a polymerizable prepolymer, a reactive diluent, and a polymerization initiator, the adhesive further comprising as a chelating agent an aminopolycarboxylic acid having at least one hydroxyethyl group bound to the nitrogen atom thereof or an alkali metal salt thereof, and as a curing accelerator cupferron or a metallic salt thereof.

DETAILED DESCRIPTION OF THE INVENTION

The chelating agent which can be used in this invention includes aminopolycarboxylic acids having at least one hydroxyethyl group bound to the nitrogen atom thereof or their salts of alkali metals (e.g., sodium). Specific examples include N-hydroxyethylethylenediamine-N, N', N'-triacetic acid and a sodium salt thereof.

Examples of the curing accelerator which can be used in this invention include cupferron and metallic salts thereof. Examples of metals contained in the metallic salts as referred to herein include copper, iron, aluminum, etc.

Examples of the polymerizable prepolymer which can be used in this invention include unsaturated polyesters having a molecular weight from 1,000 to 10,000 and containing therein ethylenically unsaturated bonds. Examples of such ethylenically unsaturated polyesters are commercially available under the trade names of, for example, Upica® 8554 (made by Nippon Upica Co., Ltd.) and New Track® 410 S (made by Kao Corporation).

Examples of the reactive diluent which can be used in this invention include diglycidyl ester di(meth)acrylates of dibasic fatty acids containing from 2 to 28 carbon atoms. They can be prepared by adding two molecules of (meth)acrylic acid to a diglycidyl ester of a dibasic fatty acid containing from 2 to 28 carbon atoms. Preferred examples of the dibasic fatty acid include saturated acids such as succinic acid, glutaric acid, adipic acid, dimethyladipic acid, suberic acid, ethylpropylglutaric acid, brassylic acid (undecanedicarboxylic acid), etc. and unsaturated acids such as heptenoic diacid, dimethyloctenoic diacid, undecenoic diacid, pentadecadienoic diacid, etc. Among them, saturated acids or unsaturated acids containing from about 10 to 30 carbon atoms are most preferable. Though the dibasic acids of this sort can be used singly, they are used to advantage in admixture thereof. Examples of such an admixture include a mixture of fatty acids obtained by reacting a Fenton's reagent with cyclohexanone, which is commercially available.

Further, as other reactive diluents, there can be mentioned monofunctional monomers containing therein one ethylenically unsaturated bond, such as 2-hydroxyethyl (meth)acrylate, tetrahydrofurfuryl (meth)acrylate, dicyclopentenyl (meth)acrylate, etc., and polyfunctional monomers containing therein a plurality of ethylenically unsaturated bonds, such as 1,6-hexanediol di(meth)acrylate, trimethylpropane tri(meth)acrylate, dipentaerythritol hexa(meth)acrylate, etc.

The polymerization initiator as referred to herein includes both a photopolymerization initiator and a heat polymerization initiator. Examples of the photopolymerization initiator are preferably compounds containing therein a benzoyl moiety, such as benzoin, benzoin methyl ether, benzoin isopropyl ether, benzophenone, acetophenone, 2-hydroxy-2-methylpropiophenone, anthraquinone, 2-ethylanthraquinone, 2-chlorothioxanthone, 1-hydroxycyclohexyl phenyl ketone, benzyldimethylketal, etc.

As the heat polymerization initiator, usual ordinary organic peroxides can be used. Specific examples include ketone peroxides such as methyl ethyl ketone peroxide, cyclohexanone peroxide, etc.; diacyl peroxides such as acetyl peroxide, benzoyl peroxide, etc.; hydroperoxides such as t-butyl hydroperoxide, cumene hydroperoxide, etc.; dialkyl peroxides such as di-t-butyl peroxide, dicumyl peroxide, etc.; alkyl peresters such as t-butyl peracetate, t-butyl perbenzoate, etc.; peroxycarbonates such as diisopropyl peroxydicarbonate, bis(4-t-butylcyclohexyl) peroxydicarbonate, etc.; and peroxyketals such as 1,1-bis(t-butylperoxy)-3,3,5-trimethylcyclohexane, 1,1-bis(t-butylperoxy)cyclohexane, etc.

However, as the polymerization initiator, a redox type heat polymerization initiator comprising cumene hydroperoxide and a quaternary ammonium salt is preferred. Examples of the quaternary ammonium salt which can be used in this invention include trimethylbenzylammonium chloride, triethylbenzylammonium chloride, etc.

Next, the amounts of the respective components comprising the adhesive of this invention will be described.

Firstly, the chelating agent is preferably used in an amount ranging from 0.01 to 1.0 part by weight based on 100 parts by weight of the polymerizable prepolymer (referred to hereinafter as component (A)). This is because if the amount of the chelating agent is less than 0.01 part by weight, the composition becomes unstable to storage, whereas if it exceeds 1.0 part by weight, not only is the adhesion strength of the cured product low, but hygroscopicity increases which leads to a reduction in electrical insulation of the cured product.

The reactive diluent (such as diglycidyl ester di(meth)acrylate of a dibasic acid containing from 2 to 28 carbon atoms) (referred to hereinafter as component (B)) is used in an amount of from 30 to 150 parts by weight based on 100 parts by weight of the component (A). When the amount of the component (B) is less than 30 parts by weight, the adhesion decreases, whereas when exceeding 150 parts by weight, the hardness of the cured product is remarkably lowered.

The amount of the photopolymerization initiator as the polymerization initiator is from 0.2 to 20 parts by weight based on 100 parts by weight of the sum of the polymerizable prepolymer and the reactive diluent ((A) + (B)). When it is less than 0.2 part by weight, the photocuring speed becomes low, and moreover, moisture resistance, mechanical properties, etc. of the cured product become deteriorated, whereas when it exceeds 20 parts by weight, the cured product of a resin having a high molecular weight cannot be obtained and, at the same time, moisture resistance remarkably lowers. In either case, the product can hardly be put into practical use.

The amount of the heat polymerization initiator used is from 0.2 to 20 parts by weight based on 100 parts by weight of the sum of the polymerizable prepolymer and the reactive diluent ((A) + (B)). When it is less than 0.2 part by weight, the heat curing speed becomes low, and moreover, moisture resistance, mechanical properties, etc. of the cured product become deteriorated whereas when it exceeds 20 parts by weight, the cured product of a resin having a high molecular weight cannot be obtained and, at the same time, moisture resistance is remarkably lowered. In either case, the product can hardly be put into practical use.

The amount of the curing accelerator used is from 0.01 to 1.0 part by weight based on 100 parts by weight of the component (A). This is because if the amount is too small, the curing accelerating function is negligible, while if too large, the heat polymerization is remarkably inhibited, whereby the adhesion strength becomes insufficient.

The composition of this invention can, if desired, contain other additives as illustrated below.

Second Curing Accelerator: Metallic salts of long-chain organic acids (metallic soaps), such as cobalt naphthenate, cobalt octenoate, manganese naphthenate, manganese octenoate, etc.; and amines such as dimethylaniline, N-phenylmorpholine, etc.

Inorganic Filler: Powders of talc, fused silica, alunimum hydroxide, etc.

Coloring Agent: Organic pigments, inorganic pigments, dyes, etc.

Thixotropic Agent: Ultrafine silica, etc.

All of the above-described additives are commonly used in the art, and they are suitably used in suitable amounts in accordance with the purposes for which the adhesive will be used.

The adhesive of this invention is not only excellent in storage stability, gel time and adhesion strength but also fully satisfactory in the points of coating properties and heat curing speed from the practical standpoint and hence, they are extremely useful as an adhesive for SMD.

Examples 1 to 3

Adhesives were prepared by compounding the following components (a) to (i) and a filler in the amounts indicated in TABLE 1 as later described.

Component (a): Unsaturated polyester having a molecular weight of about 2,500 (prepolymer) [manufactured by Nippon Upica Co., Ltd.: Upica ® 8554].

Component (b): Diglycidyl ester diacrylate of a dibasic unsaturated fatty acid containing from 16 to 20 carbon atoms [manufactured by Okamura Seiyu Co., Ltd.; ULB 20GA].

Component (c): 2-Hydroxyethyl methacrylate.

Component (d): Phenoxyethyl methacrylate.

Component (e): 1-Hydroxycyclohexyl phenyl ketone.

Component (f): 70% Cumene hydroperoxide in cumene.

Component (g): Triethylbenzylammonium chloride.

Component (h): Cupferron.

Component (i): Trisodium N-hydroxyethylethylenediamineN,N', N'-triacetate.

Filler: Talc of 3 microns in average particle diameter.

With respect to the adhesives prepared, the storage stability, gel time, and adhesion strength were measured with the results being shown in TABLE 1 as later described. The methods of measurement employed are as follows.

Storage Stability 100 g of the adhesive was placed in a light-shaded 100-ml polypropylene vessel and stored at 40° C. The number of days elapsed before the gelation occurred was investigated.

Gel Time

The gel time was measured in accordance with JIS K-6901. Items 4 and 6. That is, an adhesive weighing 5 to 6 g was charged into a test tube having a length of 15 cm, and a tip of a thermometer was kept in the center portion of the adhesive. The test tube was fixed in a thermostat kept at 100±1° C. such that a surface of the adhesive was located about 1 cm below the liquid level. Then, the time until the temperature of the adhesive reached the maximum value was measured.

Adhesion Strength 0.8 mg of the adhesive was applied onto a printed circuit board and, after an SOT (1.5 mm × 2.9 mm) was mounted in the central part thereof, the assembly was irradiated with an ultraviolet light for 20 seconds at a distance of 20 cm from a high-pressure mercury vapor lamp having a power input of 80 W/cm. Immediately thereafter, the assembly was heated for 10 minutes in an atmosphere at 150° C. Then, the shear adhesion strength per chip (kg/SMD) was measured at room temperature. The SOT is pushed in the direction rectangular to the longitudinal axis of the SOT with a push-pull-gauge. Then, the shear force in kg is measured each of ten times, among which the smallest shear force has to exceed the specified value of 2.0 kg.

Comparative Examples 1 to 9

Adhesives were respectively prepared in the same manner as in EXAMPLES 1 TO 3, except that the component (h) and/or the component (i) were/was replaced by the following components (h') and/or (i'), respectively.

Component (h'): p-Methoxyphenol.
Component (i'): Tetrasodium ethylenediaminetetraacetate.

With respect to the adhesives prepared, the same measurements were made as in EXAMPLES 1 TO 3, with the results being also shown in TABLE 1.

TABLE 1

|  | EXAMPLE NO. | | | COMPARATIVE EXAMPLE NO. | | |
|---|---|---|---|---|---|---|
|  | 1 | 2 | 3 | 1 | 2 | 3 |
| Composition | | | | | | |
| Component (a) | 100[1] | 100 | 100 | 100 | 100 | 100 |
| Component (b) | 80 | 80 | 80 | 80 | 80 | 80 |
| Component (c) | 60 | 60 | 60 | 60 | 60 | 60 |
| Component (d) | 60 | 60 | 60 | 60 | 60 | 60 |
| Component (e) | 6 | 6 | 6 | 6 | 6 | 6 |
| Component (f) | 5 | 5 | 5 | 5 | 5 | 5 |
| Component (g) | 1 | 1 | 1 | 1 | 1 | 1 |
| Component (h) | 0.2 | 0.5 | 0.1 | — | 0.2 | 0.2 |
| Component (h') | — | — | — | 0.2 | — | — |
| Component (i) | 0.2 | 0.1 | 0.5 | — | — | — |
| Component (i') | — | — | — | 0.2 | — | 0.2 |
| Filler | 200 | 200 | 200 | 200 | 200 | 200 |
| Physical Properties | | | | | | |
| Storage Stability | ≧30 days | ≧30 days | ≧30 days | 2 days | 10 days | 15 days |
| Gel Time (min.) | 5.00 | 7.00 | 4.25 | 9.75 | 5.00 | 5.25 |
| Adhesion Strength (kg/SMD) | 5.5 | 5.3 | 5.6 | 1.2 | 3.3 | 3.5 |

TABLE 1-continued

|  | COMPARATIVE EXAMPLE NO. | | | | | |
|---|---|---|---|---|---|---|
|  | 4 | 5 | 6 | 7 | 8 | 9 |
| Composition | | | | | | |
| Component (a) | 100 | 100 | 100 | 100 | 100 | 100 |
| Component (b) | 80 | 80 | 80 | 80 | 80 | 80 |
| Component (c) | 60 | 60 | 60 | 60 | 60 | 60 |
| Component (d) | 60 | 60 | 60 | 60 | 60 | 60 |
| Component (e) | 6 | 6 | 6 | 6 | 6 | 6 |
| Component (f) | 5 | 5 | 5 | 5 | 5 | 5 |
| Component (g) | 1 | 1 | 1 | 1 | 1 | 1 |
| Component (h) | — | 2.0 | 0.5 | 0.1 | — | — |
| Component (h') | 0.2 | — | — | — | 0.5 | 0.1 |
| Component (i) | 0.2 | 0.2 | — | — | 0.1 | 0.5 |
| Component (i') | — | — | 0.1 | 0.5 | — | — |
| Filler | 200 | 200 | 200 | 200 | 200 | 200 |
| Physical Properties | | | | | | |
| Storage Stability | 2 days | ≧30 days | 20 days | 15 days | 2 days | 1 day |
| Gel Time (min.) | 9.50 | 10.50 | 7.25 | 4.5 | 11.00 | 9.50 |
| Adhesion Strength (kg/SMD) | 1.4 | 0.9 | 3.6 | 3.7 | 1.3 | 1.2 |

[1] the units of numerical values concerning the components and the agent are parts by weight.

While the invention has been described in detail and with reference to specific embodiments thereof, it will be apparent to one skilled in the art that various changes and modifications can be made therein without departing from the spirit and scope thereof.

What is claimed is:

1. An adhesive for surface mounting devices comprising a polymerizable prepolymer, a reactive diluent, and a polymerization initiator, said adhesive further comprising as a chelating agent an aminopolycarboxylic acid having at least one hydroxyethyl group bound to the nitrogen atom thereof or an alkali metal salt thereof, and as a curing accelerator cupferron or a metallic salt thereof.

2. An adhesive as in claim 1, wherein said chelating agent is used in an amount of from 0.01 to 1.0 part by weight based on 100 parts by weight of said polymerizable prepolymer.

3. An adhesive as in claim 1, wherein said curing accelerator is used in an amount of from 0.01 to 1.0 part by weight based on 100 parts by weight of said polymerizable prepolymer.

4. An adhesive as in claim 1, wherein said chelating agent is N-hydroxyethylethylenediamine-N,N',N'-triacetic acid or a sodium salt thereof.

5. An adhesive as in claim 1, wherein said polymerizable prepolymer is an ethylenically unsaturated polyester having a molecular weight from 1,000 to 10,000.

6. An adhesive as in claim 1, wherein said reactive diluent is a diglycidyl ester diacrylate or dimethacrylate of a dibasic fatty acid containing from 2 to 28 carbon atoms.

7. An adhesive as in claim 1, wherein said polymerization initiator is a photopolymerization initiator.

8. An adhesive as in claim 1, wherein said polymerization initiator is a redox type heat polymerization initiator comprising cumene hydroperoxide and a quaternary ammonium salt.

* * * * *